United States Patent
Vegas Olmos et al.

(10) Patent No.: US 11,749,963 B2
(45) Date of Patent: Sep. 5, 2023

(54) SOFTWARE-DEFINED TRANSISTOR-LIKE VCSEL-BASED COMMUNICATION SYSTEM WITH A UNIVERSAL DRIVER AND ASSOCIATED METHOD

(71) Applicant: Mellanox Technologies Denmark ApS, Roskilde (DK)

(72) Inventors: Juan Jose Vegas Olmos, Solrod Strand (DK); Roy Naveh, Binyamina (IL); Elad Mentovich, Tel Aviv (IL)

(73) Assignee: Nvidia Denmark ApS, Roskilde (DK)

( * ) Notice: Subject to any disclaimer, the term of this patent is extended or adjusted under 35 U.S.C. 154(b) by 619 days.

(21) Appl. No.: 16/846,636

(22) Filed: Apr. 13, 2020

(65) Prior Publication Data

US 2021/0320475 A1    Oct. 14, 2021

(51) Int. Cl.
*H01S 5/042*    (2006.01)
*H01S 5/026*    (2006.01)
*H01S 5/06*    (2006.01)
*H01S 5/183*    (2006.01)

(52) U.S. Cl.
CPC .......... *H01S 5/0427* (2013.01); *H01S 5/0261* (2013.01); *H01S 5/0617* (2013.01); *H01S 5/183* (2013.01)

(58) Field of Classification Search
CPC .... H01S 5/0427; H01S 5/0261; H01S 5/0617; H01S 5/183; H04B 10/504
See application file for complete search history.

(56) References Cited

U.S. PATENT DOCUMENTS

| | | | |
|---|---|---|---|
| 6,975,658 B1 * | 12/2005 | Roach | H01S 5/06832 372/29.01 |
| 2004/0114649 A1 * | 6/2004 | Asuri | H01S 5/06832 372/38.02 |
| 2007/0116076 A1 * | 5/2007 | Wang | H04B 10/564 372/38.07 |
| 2013/0051420 A1 * | 2/2013 | Su | H01S 5/06226 372/45.013 |
| 2015/0318666 A1 * | 11/2015 | Ham | H01S 5/187 372/45.01 |
| 2019/0097722 A1 * | 3/2019 | McLaurin | H01S 5/02251 |

FOREIGN PATENT DOCUMENTS

JP    4803992 B2 *    10/2011    ............. H01S 5/183

OTHER PUBLICATIONS

Machine translation of JP4803992B2 (Year: 2011).*

* cited by examiner

*Primary Examiner* — Yuanda Zhang
(74) *Attorney, Agent, or Firm* — Moore & Van Allen PLLC; Michael M. McCraw

(57) ABSTRACT

Embodiments are disclosed for driving a vertical cavity surface emitting laser (VCSEL). An example method includes injecting, via a universal driver, a direct current (DC) bias current to a VCSEL. The VCSEL is configured to convert the modulated signal into an optical signal encoding one or more bits. The example method further includes providing a modulated signal to the VCSEL. The modulated signal encodes a digital sequence comprising the one or more bits using a modulation method.

18 Claims, 7 Drawing Sheets

SOFTWARE-DEFINED TRANSISTOR-LIKE VCSEL-BASED COMMUNICATION SYSTEM WITH A UNIVERSAL DRIVER AND ASSOCIATED METHOD

BACKGROUND

Optical communications have fundamentally enabled many advances in networks over the last decades. For example, because information no longer needs to be processed at the place where it has been harvested or generated, information can be transported to dedicated spaces for computation. As a result, cloud computing and edge computing are enabled and have changed the landscape of the Internet. The transfer of information between data centers or high-performance computing clusters (HPC), or intra-data center or intra-HPC, usually makes use of optical communication systems that require laser sources for generating the light channels. The light conveying the information can be generated either through external modulators (e.g., Mach-Zehnder modulators or micro-ring modulators) or directly by the same device that generates the light (e.g., externally modulated lasers (EMLs) or vertical cavity surface emitting lasers (VCSELs)). VCSELs may be driven by a driver. Applicant has identified a number of deficiencies and problems associated with drivers for VCSEL. Through applied effort, ingenuity, and innovation, many of these identified problems have been solved by developing solutions that are included in embodiments of the present disclosure, many examples of which are described in detail herein.

BRIEF SUMMARY

Example embodiments described herein disclose a method and a system for driving a VCSEL in an optical communication system. The details of some embodiments of the subject matter described in this specification are set forth in the accompanying drawings and the description below. Other features, aspects, and advantages of the subject matter will become apparent from the description, the drawings, and the claims. In accordance with an example embodiment, a system for optical communication is provided. The system includes: a vertical cavity surface emitting laser (VCSEL); and a universal driver configured to drive the VCSEL through three pins of the VCSEL, by at least providing in parallel: a direct current (DC) bias current to the VCSEL; a modulated signal to the VCSEL. In some embodiments, the modulated signal encodes a digital sequence comprising one or more bits using a modulation method. In some embodiments, the VCSEL is configured to convert the modulated signal into an optical signal encoding the digital sequence.

In some embodiments, the DC bias current is correlated with an available bandwidth associated with the VCSEL. In some embodiments, the universal driver is configured to provide the DC bias current to be delivered through the three pins. In some embodiments, the three pins are associated with a cathode, an anode, and a base.

In some embodiments, an amplitude associated with the modulated signal provides an extinction ratio for the VCSEL to comply with a defined communication standard. In some embodiments, the amplitude associated with the modulated signal is adjustable. In some embodiments, the system further includes a clock data recovery unit (CDRu) configured to provide a signal associated with the modulated signal. In some embodiments, the universal driver is configured to convert the signal to the modulated signal. In some embodiments, the universal driver is controlled by a microcontroller. In some embodiments, the microcontroller is configured to operate according to a switchable operating state set comprising one or more operating states that each defines the amplitude associated with the modulated signal and the DC bias current.

In some embodiments, the microcontroller is configured to initialize based on an initial operating state of the one or more operating states. In some embodiments, the initial operating state is pre-defined based on a silicon characterization of the microcontroller.

In some embodiments, the one or more operating states are each defined to be associated with and switched based on one or more of: an average optical output power, the available bandwidth, the extinction ratio, or an impedance associated with the VCSEL. In some embodiments, the impedance associated with the VCSEL is adjusted based on the DC bias current.

In another embodiment, a method for operating a vertical cavity surface emitting laser (VCSEL) is provided. The method includes injecting, via a universal driver, a direct current (DC) bias current to a vertical cavity surface emitting laser (VCSEL). The VCSEL is configured to convert the modulated signal into an optical signal encoding one or more bits. The method further includes providing a modulated signal to the VCSEL. The modulated signal encodes a digital sequence comprising the one or more bits using a modulation method.

In some embodiments, the DC bias current is correlated with an available bandwidth associated with the VCSEL. In some embodiments, the universal driver is configured to provide the DC bias current to be delivered through the three pins. In some embodiments, the three pins are associated with a cathode, an anode, and a base.

In some embodiments, an amplitude associated with the modulated signal provides an extinction ratio for the VCSEL to comply with a defined communication standard. In some embodiments, the amplitude associated with the modulated signal is adjustable. In some embodiments, the system further includes a clock data recovery unit (CDRu) configured to provide a signal associated with the modulated signal. In some embodiments, the universal driver is configured to convert the signal to the modulated signal. In some embodiments, the universal driver is controlled by a microcontroller. In some embodiments, the microcontroller is configured to operate according to a switchable operating state set comprising one or more operating states that each defines the amplitude associated with the modulated signal and the DC bias current.

In some embodiments, the microcontroller is configured to initialize based on an initial operating state of the one or more operating states. In some embodiments, the initial operating state is pre-defined based on a silicon characterization of the microcontroller.

In some embodiments, the one or more operating states are each defined to be associated with and switched based on one or more of: an average optical output power, the available bandwidth, the extinction ratio, or an impedance associated with the VCSEL. In some embodiments, the impedance associated with the VCSEL is adjusted based on the DC bias current.

BRIEF DESCRIPTION OF THE DRAWINGS

Figure 1:
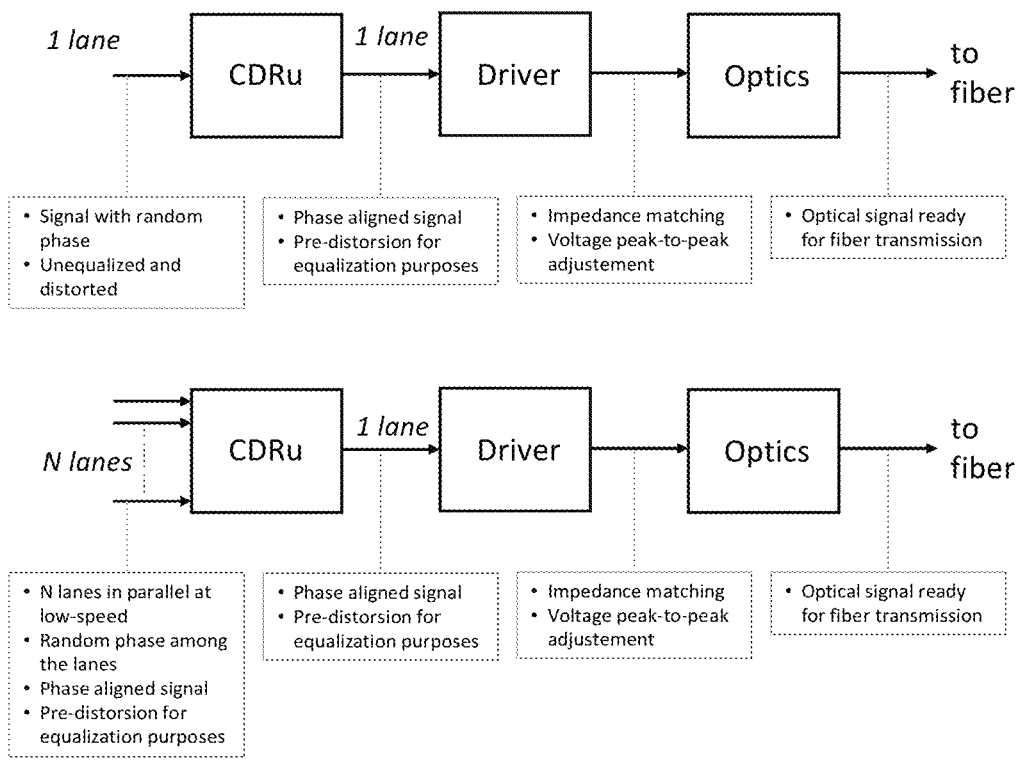
Figure 2A:
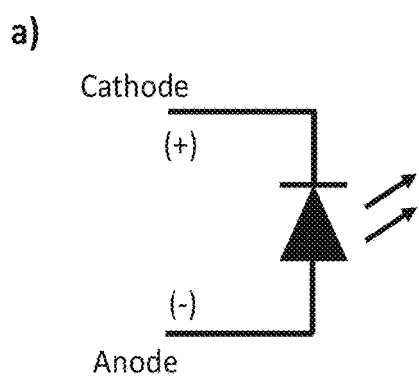
Figure 2B:
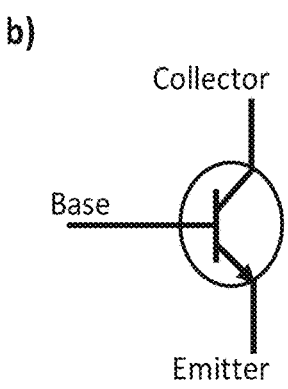
Figure 2C:
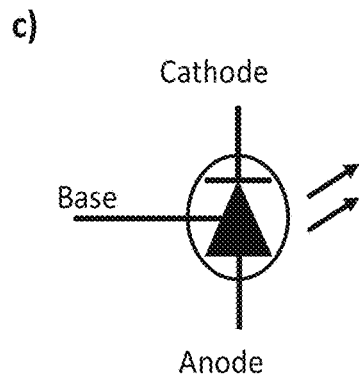
Figure 3A:
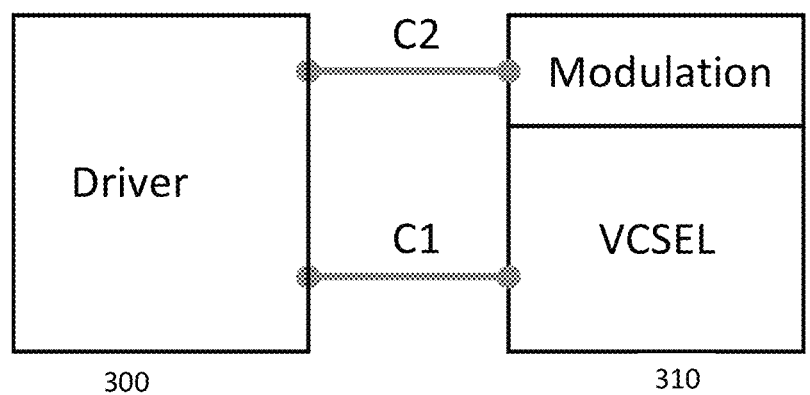
Figure 3B:
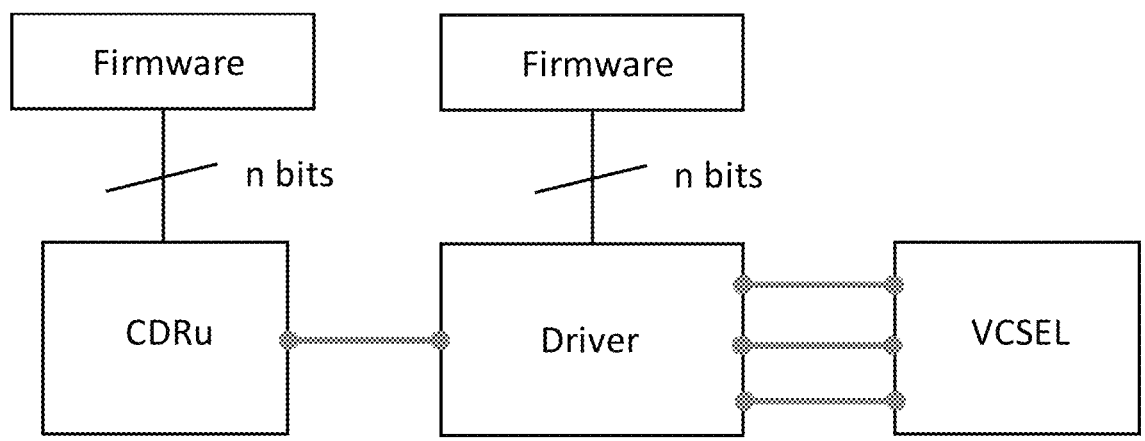
Figure 4:
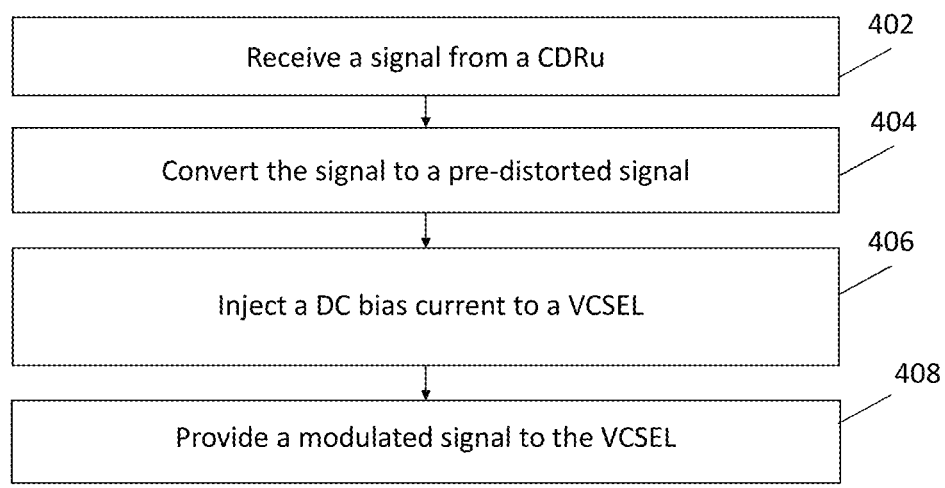
Figure 5:
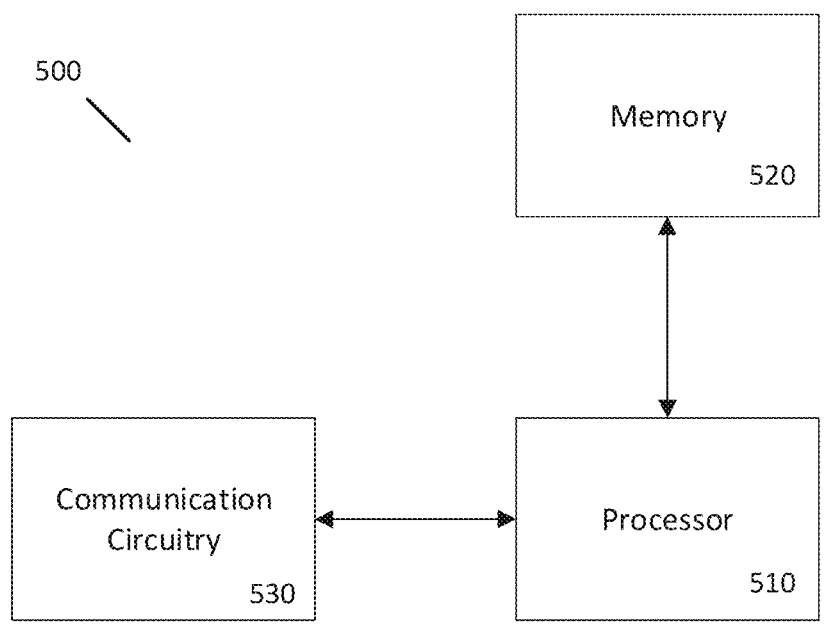
Figure 6:
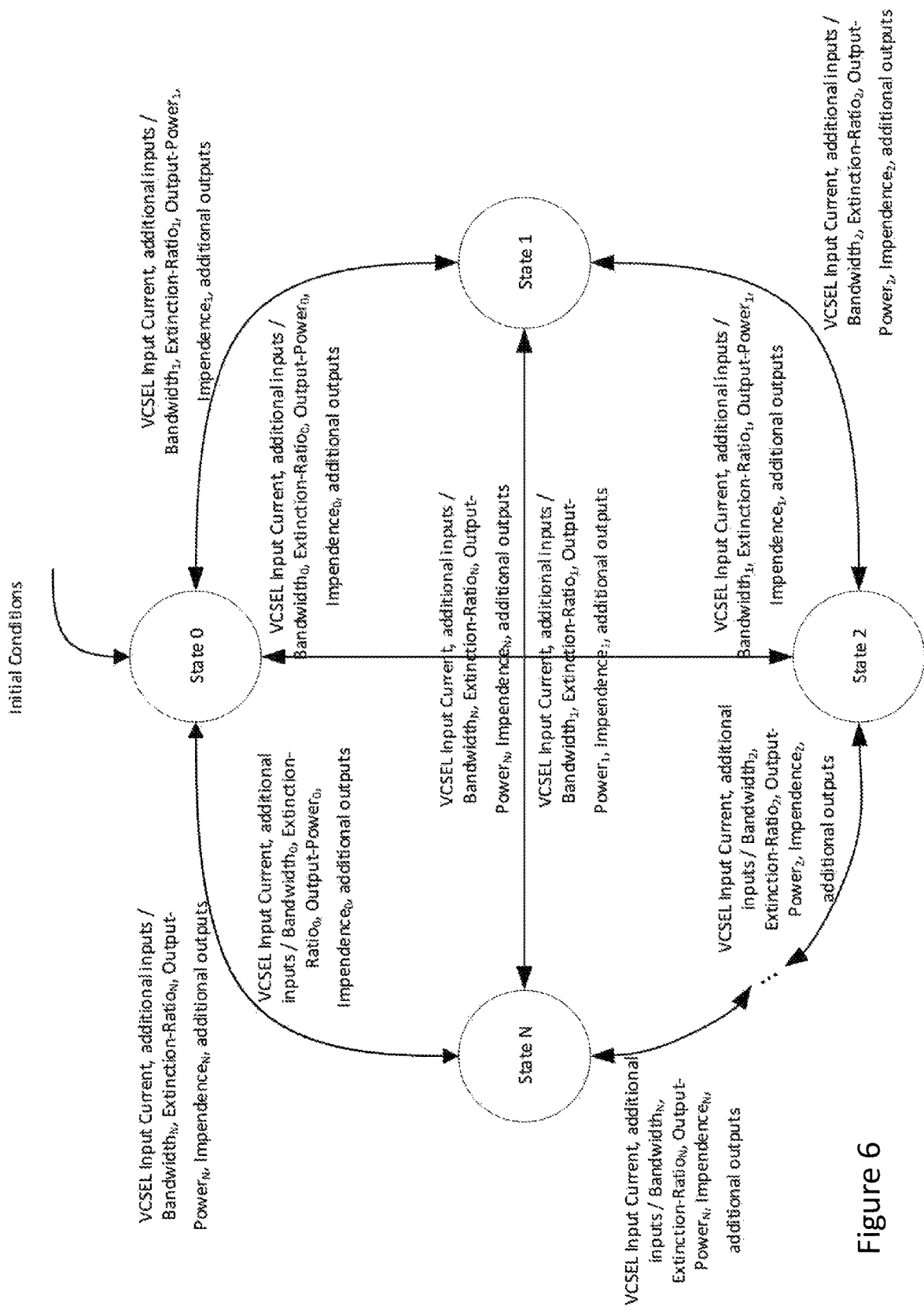

Having thus described the invention in general terms, reference will now be made to the accompanying drawings, which are not necessarily drawn to scale, and wherein:

FIG. 1 illustrates an example optical communication system according to example embodiments of the present invention;

FIGS. 2A-2C provide various schematics for components in an optical communication system according to example embodiments of the present disclosure;

FIG. 3A illustrates an example universal driver providing a direct current (DC) bias current C1 and a modulated signal C2 to a VCSEL according to example embodiments of the present disclosure;

FIG. 3B illustrates an example firmware controlling a clock data recovery unit and a universal driver according to example embodiments of the present disclosure;

FIG. 4 is a flowchart illustrating an example method of operation of a universal driver utilized to drive a VCSEL according to example embodiments of the present disclosure;

FIG. 5 illustrates an example computing microcontroller that may control the universal driver according to example embodiments of the present disclosure; and FIG. 6 illustrates example operating states of a firmware enabled by a microcontroller according to example embodiments of the present disclosure.

DETAILED DESCRIPTION OF THE INVENTION

Example embodiments will now be described more fully hereinafter with reference to the accompanying drawings, in which some, but not all, embodiments are shown. Indeed, the embodiments may take many different forms and should not be construed as limited to the embodiments set forth herein; rather, these embodiments are provided so that this disclosure will satisfy applicable legal requirements. Like reference numerals refer to like elements throughout. The term "exemplary," as may be used herein, is not provided to convey any qualitative assessment, but instead merely to convey an illustration of an example. Thus, use of any such terms should not be taken to limit the spirit and scope of embodiments of the present invention.

Optical communications have fundamentally enabled many advances in networks over the last decades. For example, because information no longer needs to be processed at the place where it has been harvested or generated, information can be transported to dedicated spaces for computation. As a result, cloud computing is enabled and has changed the landscape of the Internet. The transfer of information between data centers or high-performance computing clusters (HPC), or intra-data center or intra-HPC, usually makes use of optical communication systems that require laser sources for generating the light channels. The light conveying the information can be generated either through external modulators (e.g., Mach-Zehnder modulators or micro-ring modulators) or directly by the same device that generates the light (e.g., externally modulated lasers (EMLs) or vertical cavity surface emitting lasers (VCSELs)).

In intra-data center communications, distances are traditionally short (<10 km) and EMLs and VCSELs are widely used. EMLs typically provide slightly better signal integrity and performance at a higher cost and a greater power consumption than VCSELs. VCSELs have been used traditionally for short-links, yielding slightly worse technical performance than EMLs, but providing the advantages of lower power consumption and lower cost.

There are different technical standards that currently co-exist for VCSEL based links. The characteristics of the different standards are provided in the table below:

| | | | | | Characteristics | | | | | |
|---|---|---|---|---|---|---|---|---|---|---|
| | | SDR | DDR | QDR | FDR10 | FDR | EDR | HDR | NDR | XDR |
| Signaling rate (Gbit/s) | | 2.5 | 5 | 10 | 10.3125 | 14.0625 | 25.78125 | 50 | 100 | 250 |
| Theoretical effective throughput in Gbit/s per 1x | | 2 | 4 | 8 | 10 | 13.64 | 25 | 50 | 100 | 250 |
| Speeds for 4x links (Gbit/s) | | 8 | 16 | 32 | 40 | 54.54 | 100 | 200 | 400 | 1000 |
| Speeds for 8x links (Gbit/s) | | 16 | 32 | 64 | 80 | 109.08 | 200 | 400 | 800 | 2000 |
| Speeds for 12x links (Gbit/s) | | 24 | 48 | 96 | 120 | 163.64 | 300 | 600 | 1200 | 3000 |
| Encoding (bits) | | 8/10 | 8/10 | 8/10 | 64/66 | 64/66 | 64/66 | 64/66 | Undefined | Undefined |
| Adapter latency | | 5 | 2.5 | 1.3 | 0.7 | 0.7 | 0.5 | less? | Undefined | Undefined |
| Year | | 2001, 2003 | 2005 | 2007 | 2011 | 2011 | 2014 | 2017 | after 2020 | future (after 2023?) |

An optical communication system, as illustrated in FIG. 1, includes a clock-data recovery unit (CDRu), a driver, and an optical subsystem. The CDRu ensures that a data stream signal encoding a digital sequence to be transmitted is phase-adjusted in terms of sampling time, and pre-equalization (e.g., pre-distortion) may be applied to the signal in order to overcome end-to-end signal distortion. In addition, the CDRu may also need to convert the arriving data stream from low-speed parallel lanes to a single high-speed lane. The universal driver processes a signal generated by the CDRu and provides a modulated signal to the optical subsystem. The universal driver may adjust amplitude (peak-to-peak voltage level) and ensure impedance matching over a wide range of frequencies to maximize efficiency in the transmission of data.

The optical subsystem may receive the modulated signal and convert it to the optical domain by direct modulation of a laser-like component, such as a VCSEL.

As illustrated in the table above, in each new generation of communication standards, the characteristics of the optical subsystem, e.g., the available bandwidth, impedance, or the like, may change depending on the underlying optical technology. This poses a huge challenge for the universal driver of the optical subsystem. In particular, it is challenging to design a driver that support different optical subsystems that each has different available bandwidth, impedance, and other characteristics. Therefore, traditionally, driver design is normally conducted tailoring the specifications of the optical subsystem to the particular use case. Thus, the universal drivers are typically tailored to a single VCSEL generation. As a result, upgrades in the link may require changing both the VCSEL and the universal driver, resulting in engineering inefficiencies and higher costs from a manufacturing standpoint.

Example embodiments described herein provide a method and an apparatus for a universal driver for VCSEL-based links. The universal driver may be compatible with multiple generations of communication standards, resulting in much higher efficiency.

FIGS. 2A-2C provide various schematics for components in an optical communication system. FIG. 2A illustrates a traditional approach of driving a VCSEL where the VCSEL is being driven as a diode comprising a cathode and an anode. FIG. 2B illustrates a schematic for a transistor, with a collector, base, and emitter port. FIG. 2C illustrates a VCSEL being driven with a transistor-like approach in accordance with embodiments of the invention, where the VCSEL comprises three pins that each represents a cathode, a base, or an anode. By driving the VCSELs as transistors instead of diodes, example embodiments resolve the problem of backwards compatibility when using optical subsystems for optical communications employing different generations of communication standards with different bandwidths. Because an injected direct current (DC) bias current may change the properties, such as the impedance, of the VCSEL, a universal driver in some embodiments may adjust the settings of the VCSEL to be compatible with different communication standards by changing the injected current, resulting in much more efficient VCSEL links.

FIG. 3A illustrates an example universal driver 300 providing a DC bias current C1 and a modulated signal C2 to a VCSEL 310. In some embodiments, the combination of currents associated with C1 and C2 may determine the available bandwidth in the VCSEL 310. The DC bias current also determines the optical output power of the VCSEL 310. In some embodiments, the frequency response and relative response of the VCSEL 310 may present a resonance peak before decay. Therefore, there may be a trade-off between optical output power and available bandwidth based on the injected DC bias current. The universal driver 300 may be configured to drive the VCSEL 310 based on optimization of either output power or available bandwidth. In some embodiments, the universal driver 300 may be configured to drive the VCSEL 310 based on optimization of available bandwidth. In some embodiments, the universal driver 300 is configured to provide the DC bias current to be delivered through three pins that represent a cathode, an anode, and a base.

In some embodiments, the modulated signal C2 may encode a digital sequence comprising one or more bits in one of a variety of modulation methods that are able to convey information by coding digital sequences into voltage levels. Examples of multilevel modulations include non-return to zero and pulse amplitude modulation, quadrature amplitude modulation, or the like. In some embodiments, the current associated with the modulated signal C2 has an amplitude sufficient to maximize the output extinction ratio or sufficient extinction ratio to comply with various communication standards. In some embodiments, the amplitude associated with the modulated signal C2 may be adjustable based on the communication standard used by the VCSEL 310. By controlling the amplitude associated with the modulated signal C2, the optical signal generated by the VCSEL 310 may be adjusted accordingly.

FIG. 3B illustrates an example firmware controlling the CDRu and the universal driver 300. As illustrated in FIG. 3B, the firmware may be providing a first set of bits controlling the CDRu and a second set of bits controlling the universal driver 300. The first set of bits may be the same or different from the second set of bits. In an embodiment, the firmware may be the same for both the CDRu and the universal driver 300. In another embodiment, the firmware may be different for the CDRu and the universal driver 300. In an aspect, the universal driver 300 controls the VCSEL 310.

FIG. 4 is a flowchart illustrating an example method of operation of a universal driver utilized to drive a VCSEL according to example embodiments of the present disclosure. In some embodiments, the universal driver is the universal driver 300.

In some embodiments, at operation 402, the universal driver 300 is configured to receive a signal from a CDRu. The signal may be associated with a modulated signal to be provided to a VCSEL (e.g., VCSEL 310) connected with the universal driver 300. The signal may be, for example, an encoded signal that encodes a digital sequence comprising one or more bits in one of a variety of modulation methods that are able to convey information by encoding digital sequences into voltage levels. Examples of multilevel modulations include non-return to zero and pulse amplitude modulation, quadrature amplitude modulation, or the like.

In some embodiments, at operation 404, the universal driver 300 is configured to convert the signal into a pre-distorted signal. Similar to the encoded signal, the pre-distorted signal may also comprise an encoded digital sequence comprising one or more bits in one of a variety of modulation methods that are able to convey information by coding digital sequences into voltage levels. In an embodiment, the pre-distorted signal is a modulated signal that encodes the digital sequence using one or more modulation methods. For instance, in some embodiments, the universal driver 300 is additionally or alternatively configured to convert the pre-distorted signal to the modulated signal (e.g., a modulated version of the pre-distorted signal). In some embodiments, the universal driver 300 may convert the pre-distorted signal into the modulated signal by adjusting amplitude (peak-to-peak voltage level).

In some embodiments, at operation 406, the universal driver 300 is configured to provide a DC bias current to a VCSEL (e.g., VCSEL 310). In parallel with the DC bias current, at operation 408, the universal driver 300 is configured to provide a modulated signal to the VCSEL. For instance, in parallel with the DC bias current, the universal driver 300 is configured to provide the modulated signal associated with the pre-distorted signal to the VCSEL, in some embodiments. The VCSEL may convert the modulated signal into an optical signal encoding the digital sequence. An amplitude associated with the modulation signal, in an embodiment, provides an extinction ratio for the VCSEL to comply with a defined communication standard. Furthermore, in some embodiments, the amplitude associated with the modulated signal is adjustable.

In some embodiments, the amplitude of the DC bias current and the modulated signal may be determined based on an operating state of the universal driver 300. In some embodiments, the universal driver 300 is controlled by a microcontroller described in more detail with reference to FIG. 5. In some embodiments, the microcontroller is configured to operate according to a switchable operating state set comprising one or more operating states that each defines the amplitude associated with the modulated signal and the DC bias current. The universal driver 300 may provide the modulated signal and the DC bias current in accordance with a current operating mode of the microcontroller. In some embodiments, each of the one or more operating states is defined to be associated with and switched based on one or more of: an average optical output power, the available bandwidth, the extinction ratio, or an impedance associated with the VCSEL. In some embodiments, the one or more of the average optical output power, the available bandwidth, the extinction ratio, or the impedance associated with the VCSEL may be obtained during a testing phase of the universal driver 300 and may be pre-defined accordingly.

In some embodiments, the VCSEL may be controlled by control lines generated by a general-purpose micro-controller and a dedicated Firmware. The Firmware implements a function with NY outputs and NX inputs. The Outputs consist of, but not only of, a digital coded representation of the Bandwidth, the Extinction ratio, the Output power and the Impedance. The Inputs consist of, but not only of, a digital coded representation of the VCSEL input current. The VCSEL input current acts as a feedback mechanism to fine tune the proper working point and VCSEL control signals. There are NS stages per input. The outputs are designed in such a matter that for each input value within a range, a set of outputs is selected. Initial conditions are pre-defined during characterization (e.g., silicon characterization). Upon receiving the VCSEL input current as Input to the micro-controller, new sets of Outputs are selected. These outputs provide the new control signals to the VCSEL. FIG. 6 and the table below illustrate example operating states of a firmware enabled by a microcontroller:

one or more operating states. The initial operating state may be pre-defined based on a silicon characterization of the microcontroller.

FIG. 5 illustrates an example computing microcontroller that may control the universal driver 300 and the CDRu according to example embodiments of the present disclosure. The microcontroller 500 may be used for performing calculations related to calibrating the driver which may be embedded in a transmitter. The microcontroller 500 may include or otherwise be in communication with a processor 510, memory circuitry 520, and communication circuitry 530. In some embodiments, the processor 510 (which may include multiple or co-processors or any other processing circuitry associated with the processor) may be in communication with the memory circuitry 520. The memory circuitry 520 may comprise non-transitory memory circuitry and may include one or more volatile and/or non-volatile memories. In some examples, the memory circuitry 520 may be an electronic storage device (e.g., a computer readable storage medium) configured to store data that may be retrievable by the processor 510. In some examples, the data stored in the memory 520 may include operating states or the like for enabling the apparatus to carry out various functions or methods in accordance with embodiments of the present invention, described herein.

In some examples, the processor 510 may be embodied in a number of different ways. For example, the processor may be embodied as one or more of various hardware processing means, such as a microcontroller unit (MCU).

In an example embodiment, the processor 510 may be configured to execute instructions, such as computer program code or instructions, stored in the memory circuitry 520 or otherwise accessible to the processor 510. Alternatively or additionally, the processor 510 may be configured to execute hard-coded functionality. As such, whether configured by hardware or software instructions, or by a combination thereof, the processor 510 may represent a computing entity (e.g., physically embodied in circuitry) configured to perform operations according to an embodiment of the present invention described herein. The processor 510 may further include a clock, an arithmetic logic unit (ALU) and logic gates configured to support operation of the processor 510, among other things.

The microcontroller 500 may optionally also include the communication circuitry 530. The communication circuitry may be any means embodied in either hardware or a combination of hardware and software that is configured to

| State | VCSEL Input Current | Average Optical Output Power [optional] | Bandwidth | Extinction-Ratio | Output Power | Impedance | Additional Outputs [optional] |
|---|---|---|---|---|---|---|---|
| 0 | $X_1 \ldots X_2$ | $X_3$ | $BW_0$ | $ER_0$ | $OP_0$ | $Im_0$ | $XXX_0$ |
| 1 | $Y_1 \ldots Y_2$ | $Y_3$ | $BW_1$ | $ER_1$ | $OP_1$ | $Im_1$ | $XXX_1$ |
| 2 | $Z_1 \ldots Z_2$ | $Z_3$ | $BW_2$ | $ER_2$ | $OP_2$ | $Im_2$ | $XXX_2$ |
| ... | ... | ... | | | | | |
| N | $W_1 \ldots W_2$ | $W_3$ | $BW_N$ | $ER_N$ | $OP_N$ | $Im_N$ | $XXX_N$ |

In some embodiments, firmware layer controls two currents which define the a) Bandwidth, b) Extinction Ratio, c) Output Power of the VCSEL, and d) Impedance. These parameters and their correlation may be extracted at testing phase of the VCSEL and the matrix of values transferred through firmware to the driver.

In some embodiments, the microcontroller is configured to initialize itself based on an initial operating state of the receive and/or transmit data from/to the universal driver 300 and/or the CDRu. In this regard, the communication interface may include, for example, supporting hardware and/or software for enabling communications. As such, for example, the communication circuitry 530 may include a communication modem and/or other hardware/software for supporting communication.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. A system for optical communication, comprising:
    a vertical cavity surface emitting laser (VCSEL); and
    a universal driver configured to drive the VCSEL through three pins of the VCSEL, by at least providing in parallel:
        a direct current (DC) bias current to the VCSEL;
        a modulated signal to the VCSEL, wherein the modulated signal encodes a digital sequence comprising one or more bits using a modulation method;
    wherein the VCSEL is configured to convert the modulated signal into an optical signal encoding the digital sequence,
    wherein the DC bias current is correlated with an available bandwidth associated with the VCSEL, wherein the universal driver is configured to provide the DC bias current to be delivered through the three pins, and wherein the three pins are associated with a cathode, an anode, and a base.

2. The system of claim 1, wherein an amplitude associated with the modulated signal provides an extinction ratio for the VCSEL to comply with a defined communication standard.

3. The system of claim 2, wherein the amplitude associated with the modulated signal is adjustable.

4. The system of claim 2 further comprising a clock data recovery unit (CDRu) configured to provide a signal associated with the modulated signal, wherein the universal driver is configured to convert the signal to the modulated signal.

5. The system of claim 2, wherein the universal driver is controlled by a microcontroller.

6. The system of claim 5, wherein the microcontroller is configured to operate according to a switchable operating state set comprising one or more operating states that each defines the amplitude associated with the modulated signal and the DC bias current.

7. The system of claim 6, wherein the microcontroller is configured to initialize based on an initial operating state of the one or more operating states, wherein the initial operating state is pre-defined based on a silicon characterization of the microcontroller.

8. The system of claim 6, wherein the one or more operating states are each defined to be associated with and switched based on one or more of: an average optical output power, the available bandwidth, the extinction ratio, or an impedance associated with the VCSEL.

9. The system of claim 6, wherein an impedance associated with the VCSEL is adjusted based on the DC bias current.

10. A method for operating a vertical cavity surface emitting laser (VCSEL), comprising:
    injecting, via a universal driver, a direct current (DC) bias current to a vertical cavity surface emitting laser (VCSEL), wherein the VCSEL is configured to convert the modulated signal into an optical signal encoding one or more bits; and
    providing a modulated signal to the VCSEL, wherein the modulated signal encodes a digital sequence comprising the one or more bits using a modulation method,
    wherein the DC bias current is correlated with an available bandwidth associated with the VCSEL, wherein the universal driver is configured to provide the DC bias current to be delivered through three pins associated with the VCSEL, and wherein the three pins are associated with a cathode, an anode, and a base.

11. The method of claim 10, wherein an amplitude associated with the modulated signal provides an extinction ratio for the VCSEL to comply with a defined communication standard.

12. The method of claim 11, wherein the amplitude associated with the modulated signal is adjustable.

13. The method of claim 11, wherein the modulated signal is converted from a signal provided by a clock data recovery unit (CDRu).

14. The method of claim 11, wherein the universal driver is controlled by a microcontroller.

15. The method of claim 14, wherein the microcontroller is configured to operate according to a switchable operating state set comprising one or more operating states that each defines the amplitude associated with the modulated signal and the DC bias current.

16. The method of claim 15, wherein the microcontroller is configured to initialize based on an initial operating state of the one or more operating states, wherein the initial operating state is pre-defined based on a silicon characterization of the microcontroller.

17. The method of claim 15, wherein the one or more operating states are each defined to be associated with and switched based on one or more of: an average optical output power, the available bandwidth, the extinction ratio, or an impedance associated with the VCSEL.

18. The method of claim 15, wherein an impedance associated with the VCSEL is adjusted based on the DC bias current.

* * * * *